(12) United States Patent
Zhu et al.

(10) Patent No.: US 10,032,827 B2
(45) Date of Patent: Jul. 24, 2018

(54) SYSTEMS AND METHODS FOR TRANSFER OF MICRO-DEVICES

(71) Applicant: Applied Materials, Inc., Santa Clara, CA (US)

(72) Inventors: Mingwei Zhu, San Jose, CA (US); Sivapackia Ganapathiappan, Los Altos, CA (US); Boyi Fu, San Jose, CA (US); Hou T. Ng, Campbell, CA (US); Nag B. Patibandla, Pleasanton, CA (US)

(73) Assignee: Applied Materials, Inc., Santa Clara, CA (US)

( * ) Notice: Subject to any disclaimer, the term of this patent is extended or adjusted under 35 U.S.C. 154(b) by 0 days.

(21) Appl. No.: 15/270,763

(22) Filed: Sep. 20, 2016

(65) Prior Publication Data

US 2018/0006083 A1    Jan. 4, 2018

Related U.S. Application Data (60) Provisional application No. 62/356,431, filed on Jun. 29, 2016.

(51) Int. Cl.
  *H01L 21/677*    (2006.01)
  *H01L 21/683*    (2006.01)
  (Continued)

(52) U.S. Cl.
  CPC ............ *H01L 27/156* (2013.01); *H01L 22/22* (2013.01); *H01L 24/741* (2013.01); *H01L 24/83* (2013.01); *H01L 33/48* (2013.01)

(58) Field of Classification Search
  None
  See application file for complete search history.

(56) References Cited

U.S. PATENT DOCUMENTS

| | | | |
|---|---|---|---|
| 2006/0035164 A1 | 2/2006 | Schaper | |
| 2006/0154390 A1* | 7/2006 | Tran | B23K 26/40 438/22 |

(Continued)

OTHER PUBLICATIONS

International Search Report and Written Opinion in International Application No. PCT/US2017/037742, dated Sep. 18, 2017, 10 pages.

(Continued)

*Primary Examiner* — Seahvosh Nikmanesh
*Assistant Examiner* — Xiaoming Liu
(74) *Attorney, Agent, or Firm* — Fish & Richardson P.C.

(57) ABSTRACT

An apparatus for positioning micro-devices on a substrate includes one or more supports to hold a donor substrate and a destination substrate, an adhesive dispenser to deliver adhesive on micro-devices on the donor substrate, a transfer device including a transfer surface to transfer the micro-devices from the donor substrate to the destination substrate, and a controller. The controller is configured to operate the adhesive dispenser to selectively dispense the adhesive onto selected micro-devices on the donor substrate based on a desired spacing of the selected micro-devices on the destination substrate. The controller is configured to operate the transfer device such that the transfer surface engages the adhesive on the donor substrate to cause the selected micro-devices to adhere to the transfer surface and the transfer surface then transfers the selected micro-devices from the donor substrate to the destination substrate.

17 Claims, 5 Drawing Sheets

(51) Int. Cl.
    *H01L 27/15*     (2006.01)
    *H01L 33/48*     (2010.01)
    *H01L 23/00*     (2006.01)
    *H01L 21/66*     (2006.01)

(56) References Cited

U.S. PATENT DOCUMENTS

| | | | |
|---|---|---|---|
| 2008/0122119 A1* | 5/2008 | Kian | H01L 21/6835 257/783 |
| 2009/0056858 A1* | 3/2009 | Davila Casitas | B41F 16/00 156/184 |
| 2010/0326702 A1* | 12/2010 | Dang | H01L 21/6835 174/250 |
| 2013/0130440 A1 | 5/2013 | Hu et al. | |
| 2013/0273695 A1 | 10/2013 | Menard et al. | |
| 2014/0267683 A1 | 9/2014 | Bibl et al. | |
| 2015/0294951 A1* | 10/2015 | Smits | C09J 5/06 438/119 |
| 2016/0124316 A1 | 5/2016 | Markle et al. | |
| 2016/0144608 A1 | 5/2016 | Chang | |
| 2016/0219684 A1 | 7/2016 | Kaskey et al. | |
| 2016/0282728 A1 | 9/2016 | Johnston et al. | |
| 2016/0336304 A1* | 11/2016 | Wu | H01L 21/6835 |
| 2017/0186730 A1* | 6/2017 | Shen | H01L 25/0657 |

OTHER PUBLICATIONS

'Terecircuits.com/photoprinting.shtml' [online]. "Terecircuits," 2015, [retrieved on Sep. 6, 2017]. Retrieved from the Internet: URL<terecircuits.com/photoprinting.shtml>, 2 pages.

* cited by examiner

SYSTEMS AND METHODS FOR TRANSFER OF MICRO-DEVICES

CROSS-REFERENCE TO RELATED APPLICATIONS

This application claims priority to U.S. Provisional Application Ser. No. 62/356,431, filed Jun. 29, 2016, the disclosure of which is incorporated by reference.

TECHNICAL FIELD

This disclosure relates to the transfer of micro-devices from a donor substrate to a destination substrate.

BACKGROUND

A variety of products include an array of individual devices on a substrate, with the devices addressable or controllable by circuitry on the substrate. For example, some display screens include an array of individually controllable pixels. In the case of light-emitting diode (LED) panels, these individual pixels can be independently controllable LEDs. The LED panels are commonly used for display screens, such as computers, touch panel devices, personal digital assistants (PDAs), cell phones, television monitors, and the like.

In general, micro-devices can be fabricated using a sequence of microfabrication techniques, such as deposition, lithography and etching, to deposit and pattern a sequence of layers. One approach for fabricating a device that includes an array of individual micro-devices is to directly fabricate the individual micro-devices on the substrate which will form part of the product. This technique has been used, e.g., to fabricate the individual micro-devices on the substrate which will form part of the product. This technique has been used, e.g., to fabricate the TFT panel and color filter panels of an active matrix liquid crystal display (LCD). However, in LED panels are difficult to manufacture in curved or bendable display.

An alternative approach for fabricating a device that includes an array of individual micro-devices is to fabricate the micro-devices en masse on a separate substrate, and then transfer the micro-devices to the substrate which will form part of the product.

SUMMARY

In one aspect, an apparatus for positioning micro-devices on a substrate includes one or more supports to hold a donor substrate and a destination substrate, an adhesive dispenser to deliver adhesive on micro-devices on the donor substrate, a transfer device including a transfer surface to transfer the micro-devices from the donor substrate to the destination substrate, and a controller. The controller is configured to operate the adhesive dispenser to selectively dispense the adhesive onto selected micro-devices on the donor substrate based on a desired spacing of the selected micro-devices on the destination substrate. The controller is configured to operate the transfer device such that the transfer surface engages the adhesive on the donor substrate to cause the selected micro-devices to adhere to the transfer surface and the transfer surface then transfers the selected micro-devices from the donor substrate to the destination substrate.

In another aspect, a method of transferring micro-devices to a destination substrate includes selectively dispensing adhesive onto selected micro-devices on a donor substrate based on a desired spacing of the selected micro-devices on the destination substrate, and engaging the adhesive on the donor substrate with a transfer surface to cause the selected micro-devices to adhere to the transfer surface. The method also includes transferring each of the selected micro-devices from the donor substrate to the destination substrate using the transfer surface and in accordance to the desired spacing of the selected micro-devices on the destination substrate.

In some implementations, the controller is configured to operate the transfer device such that the transfer surface transfers first micro-devices to the destination substrate and then transfers second micro-devices to the destination substrate such that the second micro-devices adjacent to the first micro-devices. The first micro-devices and the second micro-devices, for example, both have the desired spacing on the destination substrate. In some cases, the controller is configured to operate the transfer device to transfer the first micro-devices from a first donor substrate and to transfer the second micro-devices from a second donor substrate.

In some implementations, the transfer device is a first transfer device. The apparatus further includes, for example, a second transfer device including a second transfer surface to transfer at least one additional micro-device to the transfer surface of the first transfer device or to the destination substrate. In some cases, the second transfer device is configured to transfer a single micro-device at a time to a receiving surface. The receiving surface is, for example, (i) the transfer surface of the first transfer device or (ii) a surface of the destination substrate. Alternatively or additionally, the controller is configured to operate the second transfer device such that the transfer surface of the second transfer device transfers the single micro-device from the donor substrate to a receiving surface to fill a gap between the selected micro-devices on the receiving surface with the single micro-device, thereby achieving a desired arrangement of the selected micro-devices on the receiving surface. Alternatively or additionally, the controller is configured to operate the adhesive dispenser to dispense adhesive on the receiving surface after the selected micro-devices are adhered to the receiving surface. The controller is, for example, configured to operate the second transfer device such that the transfer surface of the second transfer device engages the single micro-device with the second dispensed adhesive when the transfer surface of the second transfer device transfers the single micro-device to the receiving surface.

In some cases, the second transfer device is configured to transfer a plurality of micro-devices to the destination substrate. In some cases, the transfer surface is a planar surface. In some cases, the second transfer device includes a roller having the second transfer surface.

In some implementations, the apparatus further includes a sensor to detect one or more defective micro-devices on the donor substrate. The controller, for example, is configured to selectively dispense the adhesive such that the adhesive is not dispensed on the one or more failed micro-devices and the selected micro-devices does not include the one or more failed micro-devices.

In some cases, the sensor includes circuitry configured to optically excite the micro-devices on the donor substrate and an optical detector to detect light emitted by the micro-devices on the donor substrate.

In some cases, the transfer device is a first transfer device. The apparatus further includes, for example, a second transfer device including a second transfer surface to transfer a single micro-device at a time to the transfer surface of the first transfer device or transfer micro-devices to the destination substrate. The controller is, for example, configured to operate the first transfer device such that the transfer surface of the first transfer device engages the adhesive on the donor substrate to cause the selected micro-devices to adhere to the transfer surface of the first transfer device. The controller is, for example, configured to operate the second transfer device such that the second transfer surface of the second transfer device transfers one or more micro-devices to the transfer surface of the first transfer device based on a location of the one or more defective micro-devices.

In some implementations, the transfer surface includes a stretchable film to receive the selected micro-devices. In some cases, the apparatus further includes an actuator coupled to the stretching film. The controller is, for example, configured to cause the actuator to stretch the film such that the selected micro-devices to have the desired spacing when the transfer surface transfers the selected micro-devices to the destination substrate.

In some implementations, the transfer device includes a roller to receive the selected micro-devices from the donor substrate.

In some implementations, the transfer surface includes a planar surface to receive the selected micro-devices from the donor substrate.

In some implementations, the transfer device includes a heating element to heat the transfer surface when the transfer surface transfers the selected micro-devices to the destination substrate.

In some implementations, the apparatus includes an etching device to etch the donor substrate, thereby forming the micro-devices.

In some implementations, the apparatus further includes a photolithography module to form electrodes on the destination substrate. The controller is, for example, configured to operate the photolithography module to form the electrodes to electrically connect the selected micro-devices to the destination substrate.

In some implementations, the apparatus further includes a radiation emitter to emit a pattern of radiation to cure at the selectively dispensed adhesive before operating the transfer device.

In some implementations, the micro-devices include light emitting diodes. In some cases, the method further includes optically exciting the light emitting diodes on the donor substrate and detecting one or more defective micro-devices on the donor substrate. The method includes, for example, selectively dispensing the adhesive such that the adhesive is not dispensed on the one or more defective micro-devices and the selected micro-devices does not include the one or more defective micro-devices. Alternatively or additionally, the method further includes transferring one or more micro-devices to the transfer surface based on a location of the one or more failed micro-devices.

In some implementations, the micro-devices are first micro-devices. The method further includes, for example, transferring the first micro-devices to the destination substrate. The method includes, for example, transferring second micro-devices to the destination substrate such that the second micro-devices are adjacent to the first micro-devices. The first micro-devices and the second micro-devices, for example, both have the desired spacing on the destination substrate. The first micro-devices are, for example, configured to emit a first color light, and the second micro-devices are configured to emit a second color light. In some cases, a selected first micro-device and a selected second micro-device adjacent to one another define a display pixel for an LED display.

In some implementations, the method further includes stretching the transfer surface to cause the selected micro-devices to have the desired spacing when the transfer surface transfers the selected micro-devices to the destination substrate.

In some implementations, a spacing of the selected micro-devices on the donor substrate corresponds to the desired spacing of the selected micro-devices on the destination substrate.

Implementations can optionally provide (and are not limited to) one or more of the advantages described below and herein elsewhere. Because the destination substrate may be formed from a material incompatible with the fabrication processes, e.g., etching and deposition, to form the micro-devices, fabricating the micro-devices and then transferring the micro-devices to the destination substrate can enable manufacturing of cost-effective and high-performance display panels. Furthermore, the micro-devices on the donor substrate can be built at a higher spatial density than desired for the destination substrate, thereby increasing throughput and saving wafer space when building the micro-devices. A large number of micro-devices can be transferred in parallel from the donor substrate to the destination substrate. The transfer of the micro-devices to the destination substrate can be performed with high precision, thereby potentially increasing yield and decreasing manufacturing time and cost. Using the detector, defective micro-devices on the donor substrate can be identified and excluded such that only functioning micro-devices are used to form a micro-device product.

The details of one or more implementations of the subject matter described in this specification are set forth in the accompanying drawings and the description below. Other potential features, aspects, and advantages will become apparent from the description, the drawings, and the claims.

DETAILED DESCRIPTION

In order to continue to provide display devices and other devices at the prices demanded by consumers, new apparatuses, approaches, and systems are needed to precisely and cost-effectively provide micro-devices on substrates, such as large area substrates or flexible substrates.

As noted above, a process of fabricating a product having an array of individual micro-devices includes building the micro-devices en masse on a donor substrate and then transferring the micro-devices to a destination substrate forming part of the product. One reason to build the micro-devices on a first substrate is that the destination substrate may be a material that incompatible with the fabrication processes, e.g., etching and deposition, used to form the micro-devices. In other examples, the fabrication processes described herein can enable manufacturing of cost-effective and high-performance display panels. Another reason to build the micro-devices on first substrate is that the micro-devices can be fabricated at higher spatial density than used for the destination substrate, thereby increasing throughput and saving wafer real estate when building the micro-devices and consequently lowering cost. This approach, in some cases, suffers from low throughput requiring "pick-and-place" methods that can be slow, inaccurate, and costly. Therefore, there is a need to improve manufacturing processes and devices that include an array of micro-devices.

To transfer micro-devices from a donor substrate to a destination substrate, as described herein, a system can selectively dispense adhesive on a subset of micro-devices on the donor substrate to control a spacing of the subset of the micro-devices when they are transferred to the destination substrate. The subset of the micro-devices upon which the adhesive is dispensed is selected such that the spacing of the subset of the micro-devices, when transferred to the destination substrate, corresponds to a desired spacing.

Figure 1:
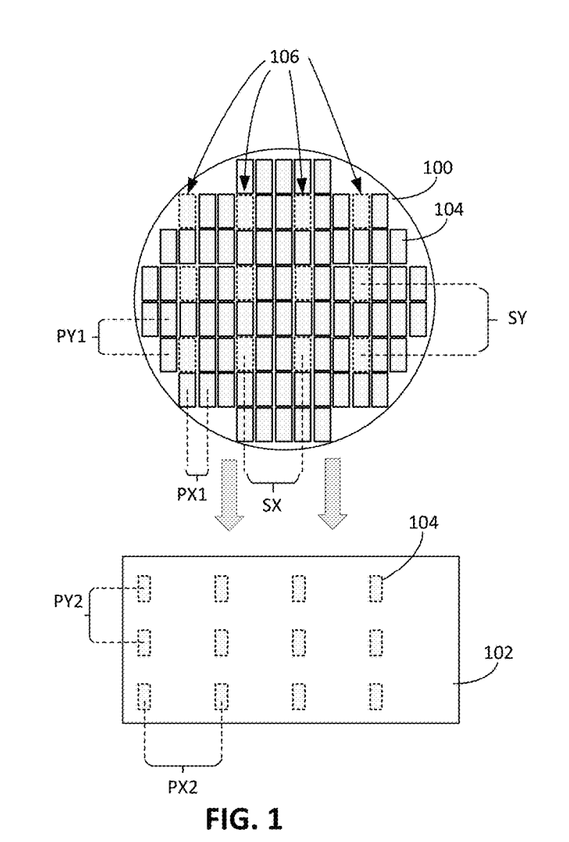
FIG. 1 is a schematic view of a donor substrate with micro-devices and a destination substrate with micro-devices.

FIG. 1 illustrates a donor substrate 100 and a destination substrate 102 each with an array of micro-devices 104. The micro-devices 104 are small electronic devices, e.g., light-emitting diodes (LEDs), such as organic LEDs (OLEDs), micro-LEDs, and the like. The micro-devices 104 are micron-scale devices, e.g., with a maximum lateral dimension of about 100 microns. For example, the devices can have a lateral dimension of about 5-50 microns, such as 5-15 microns, 15 to 35 microns, 35 to 50 microns, and other appropriate lateral dimensions. The micro-devices 104 can be identical, i.e., same dimensions, circuit pattern and layer structure.

The micro-devices 104 can be fabricated directly on the donor substrate 100, or the micro-devices 104 can be fabricated on another substrate, e.g., a device substrate, and then transferred to the donor substrate 100. In some examples, the transfer of the micro-devices 104 from the device substrate to the donor substrate 100 does not alter the spacing between the micro-devices. For example, the micro-devices can be fabricated at relatively high density on the device substrate, and the device substrate can be removed or singulated so that each micro-device 104 is individually attached to the donor substrate. Although FIG. 1 illustrates the micro-devices 104 in a regular rectangular array with pitch PX1 and PY1 in the two perpendicular directions parallel to the face of the donor substrate 100, other array configurations are possible, e.g., staggered rows.

The micro-devices 104 on the donor substrate 100 have a horizontal pitch PX1 and a vertical pitch PY1. A subset 106 of the micro-devices 104 (the micro-devices 104 shown with dashed edges in FIG. 1) have an initial configuration in which the micro-devices 104 have a first spacing SX and a second spacing SY in the two perpendicular directions parallel to the face of the destination substrate 102. When the subset 106 of the micro-devices 104 is transferred to the destination substrate 102, the subset 106 of the micro-devices 104 on the destination substrate 102 have a final configuration in which the micro-devices 104 have pitch PX2 and PY2 in the two perpendicular directions parallel to the face of the destination substrate 102. The pitch PX2 and pitch PY2, for example, correspond to desired pitches for the micro-devices 104 on the micro-device product to be fabricated.

If the horizontal spacing SX and the vertical spacing SY are selected to correspond to the pitch PX2 and the pitch PY2, respectively, the spacing between the micro-devices 104 in the subset 106 on the donor substrate 100 need not be additionally altered before the subset 106 is transferred to the destination substrate 102. In such a case, the initial configuration matches the final configuration.

In some implementations, before being transferred to the destination substrate 102, the subset 106 of the micro-devices 104 can be manipulated to increase or decrease the initial spacing SX and/or SY such that the final horizontal spacing and the final vertical spacing matches the desired pitch PX2 and PY2, respectively, on the destination substrate 102. In such a case, the initial configuration may not match the final configuration but may be transformed to achieve the final configuration before the subset 106 of the micro-devices 104 is transferred to the destination substrate 102. The spacing SX, SY for the initial configuration can be selected to reduce the magnitude of the alteration of the initial spacing SX, SY before the subset 106 having the final configuration is transferred to the destination substrate 102.

Figure 2A:
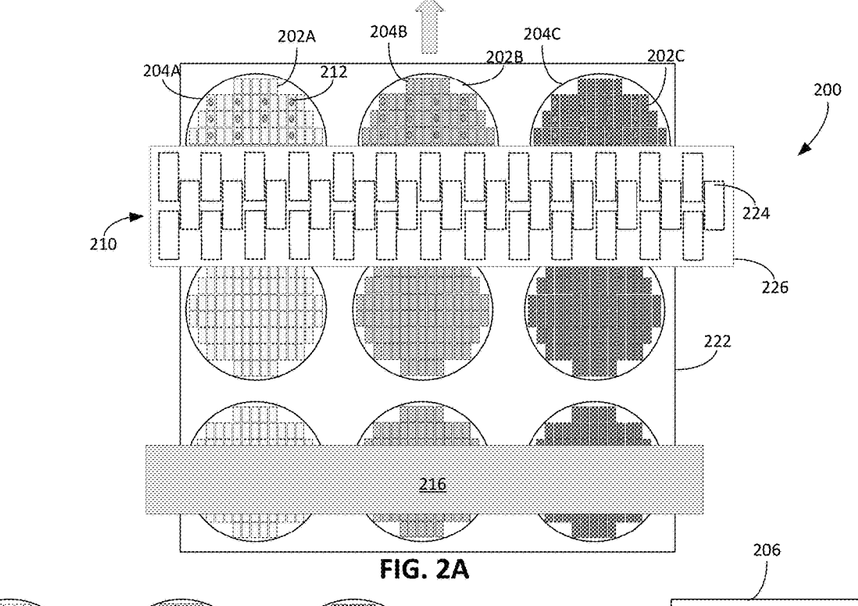
FIGS. 2A to 2C schematically depict an example of a system to transfer micro-devices from a donor substrate to a destination substrate.
Figure 2B:
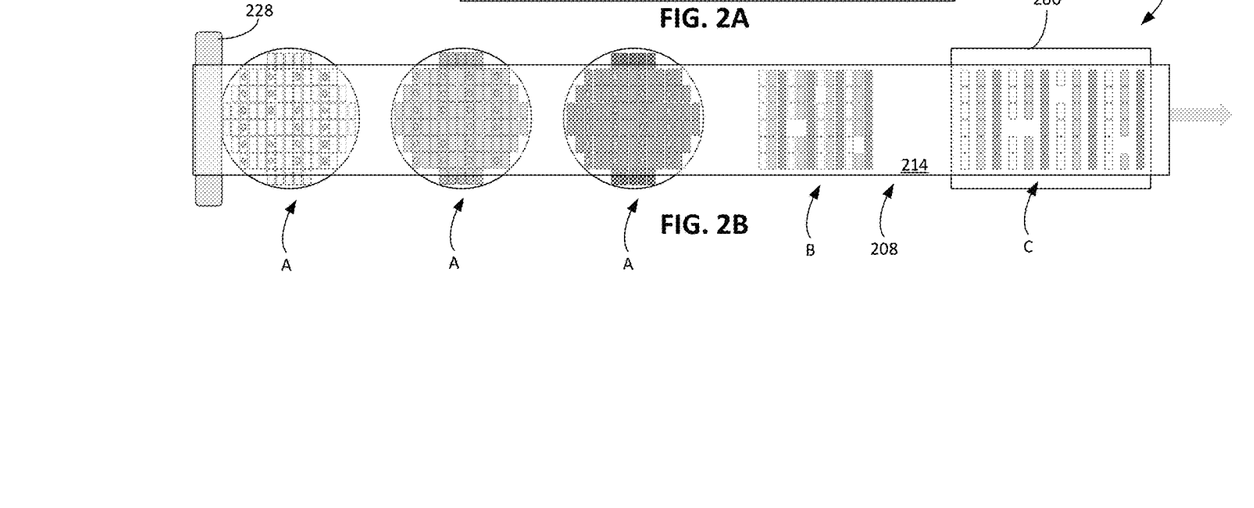
Figures 4, 5:
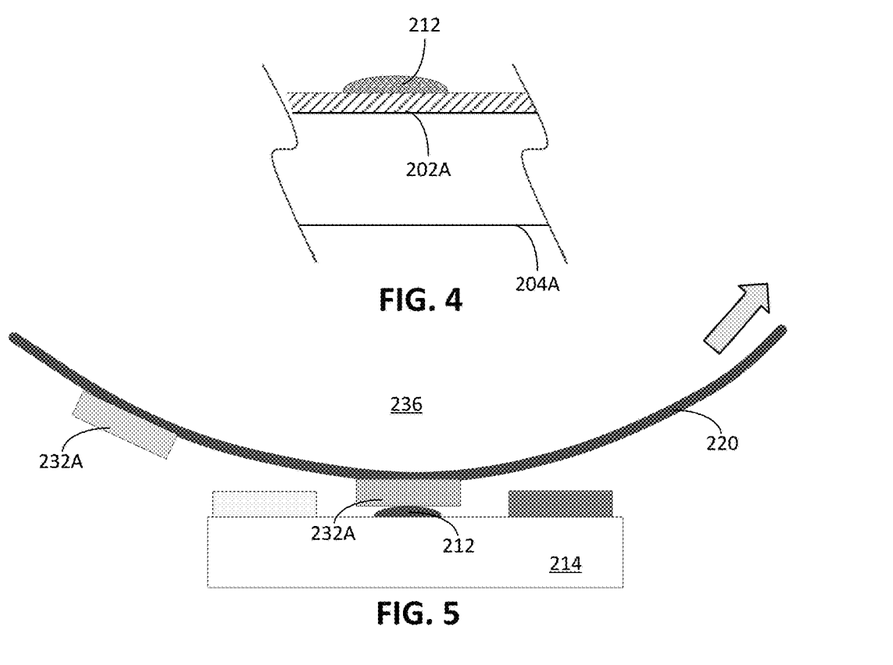
FIG. 4 is a side view of adhesive on a micro-device.
FIG. 5 is a side view of first and second transfer surfaces.

FIGS. 2A, 2B, 2C, and 3 illustrate an example of a transfer system 200 to transfer micro-devices 202A from a donor substrate 204A (FIGS. 2A, 2B) to a destination substrate 206 (FIG. 2B) using a transfer device 208 (FIG. 2B). The transfer system 200 further includes an adhesive dispenser 210, as shown in FIG. 4, that delivers adhesive 212 to the donor substrate 204A, in particular, onto the micro-devices 202A positioned on the donor substrate 204A. The dispenser 210 is, for example, a printhead configured to dispense a pico to sub-picoliter of adhesive onto a micro-device. In some implementations, as shown in FIG. 4, a droplet of the adhesive 212 is placed on a surface of the micro-device 202A, e.g., an exposed outer surface. In some examples, a coating of the adhesive 212 is applied to the surface of the micro-device 202A.

In an example of a control system 300 (FIG. 3) for the transfer system 200, a controller 302 controls operations of the transfer system 200 to transfer the micro-devices 202A from the donor substrate 204A to the destination substrate 206. The controller 302 operates the adhesive dispenser 210, e.g., to control selective delivery of the adhesive 212 to the micro-devices 202A. The controller 302 also operates the transfer device 208, e.g., to control transfer of the micro-devices 202A from the donor substrate 204A to the destination substrate 206 using a transfer surface 214 of the transfer device 208.

In some implementations, the transfer system 200 includes a detector 216. The controller 302 operates the detector 216, if present, to detect failed micro-devices among the micro-devices 202A on the donor substrate 204A.

Furthermore, in some cases, the transfer system 200 includes a second transfer device 218 including a transfer surface 220. The controller 302 operates the second transfer device 218, if present, to transfer single micro-devices 202A to a receiving surface, such as the transfer surface 214 or the destination substrate 206.

The controller 302 operates the adhesive dispenser 210 to selectively dispense the adhesive 212 onto selected micro-devices 202A on the donor substrate 204A based on a desired spacing of the selected micro-devices 202A on the destination substrate 206. The controller 302 then operates the transfer device 208 such that the transfer surface 214 of the transfer device 208 engages the adhesive 212 on the donor substrate 204A. The selected micro-devices 202A adhere to the transfer surface 214 of the transfer device 208 such that the micro-devices 202A are transferred from the donor substrate 204A to the transfer surface 214. The controller 302 then operates the transfer device 208 such that the transfer surface 214 transfers each of the selected micro-devices 202A from the donor substrate 204A to the destination substrate 206 in accordance to the desired spacing of the selected micro-devices 202A on the destination substrate 206.

The donor substrate 204A and the adhesive dispenser 210 are movable relative to one another to control the location where adhesive 212 is dispensed. In some implementations, the donor substrate 204A is supported on a support 222. The support 222 is, for example, movable horizontally under the adhesive dispenser 210 to control the location where adhesive 212 is dispensed from the adhesive dispenser 210 on the donor substrate 204A. As the support 222 is moved, the controller 302 controls the timing of ejection of the adhesive 212 from the adhesive dispenser 210 to control which of the micro-devices 202A receives the adhesive 212. In some cases, instead of the support 222 moving relative to the adhesive dispenser 210, the support 222 remains stationary and the adhesive dispenser 210 is translated relative to the support 222 such that movement of the adhesive dispenser 210 controls the location where the adhesive 212 is dispensed.

The adhesive dispenser 210, in some cases, dispenses the adhesive 212 on a single micro-device 202A when the adhesive dispenser 210 is at a given position relative to the donor substrate 204A. In some implementations, the adhesive dispenser 210 includes an array of printheads 224 supported on a gantry 226 above the donor substrate 204A. In this case, the adhesive dispenser 210 can dispense the adhesive 212 onto multiple micro-devices simultaneously. The printheads 224 are selectively addressable, e.g., by the controller 302, such that the adhesive 212 is selectively delivered to the micro-devices 202A. The printheads 224 of the adhesive dispenser 210, for example, span a width of the donor substrate 204A such that the printheads 224 are capable of delivering adhesive 212 to any micro-devices 202A in a row across the donor substrate 204A.

The adhesive dispenser 210 and the donor substrate 204A are movable relative to one another in one or both horizontal directions. For example, if the adhesive dispenser 210 dispenses the adhesive 212 to one micro-device 202A at a time, relative movement in both directions may be sufficient to enable delivery of adhesive 212 to each of the micro-devices 202A. In contrast, if the adhesive dispenser 210 dispenses the adhesive 212 to multiple micro-devices 202A at a time, relative movement in a single direction may be sufficient to enable the adhesive 212 to be delivered to each of micro-devices 202A. For example, if the adhesive dispenser 210 is supported by the gantry 226, the gantry 226 can be movable above the donor substrate in one or both horizontal directions.

Referring to FIG. 2B, after the adhesive 212 is delivered to the selected micro-devices 202A, the transfer device 208 is operated to transfer the micro-devices 202A with the adhesive 212 to the transfer surface 214 of the transfer device 208. The transfer surface 214 engages the adhesive 212 delivered to the micro-devices 202A and then is operated to remove the micro-devices 202A from the donor substrate 204A. The adhesive 212 provides sufficient adhesive strength such that, for example, the transfer surface 214 can be lifted from the donor substrate 204A with the micro-devices 202A attached to the transfer surface 214.

To cause the adhesive 212 to adhere to the transfer surface 214 and thereby cause the micro-devices 202 to attach to the transfer surface 214, the transfer device 208 includes, for example, a rotatable roller 228. The roller 228 is, for example, a pressure transfer roller that imparts a pressure on the transfer surface 214 when the transfer surface 214 is positioned against the adhesive 212 on the micro-devices 202A. Alternatively or additionally, the roller 228 is a heated transfer roller that uses heat to cure the adhesive to increase the adhesion between the micro-devices 202A and the transfer surface 214. Instead of a roller, the transfer surface 214 could be a planar surface of a flat plate.

In some examples, the neutralizing system of the transfer device 208 includes a radiation emitter that emits radiation, e.g., ultraviolet (UV) light, to cure the adhesive. In some implementations, the adhesive is activated using the UV light. Alternatively or additionally, the adhesive is applied to a select set of micro-devices 202A, e.g., in a predefined area, and then activated on desired micro-devices 202A using a patterned array of UV light. The radiation emitter, for example, is activated when the transfer surface 214 is placed against the adhesive 212 such that the micro-devices 202A become attached to the transfer surface 214 only after the radiation is emitted to cure the adhesive. In some examples, the radiation emitter is incorporated into the roller 228, if present.

The system can be an illumination system to selectively direct light from the light source onto the back side of the body that provides the transfer surface 214. Alternatively, the system can include individually controllable heaters embedded in the body that provides the transfer surface 214.

When the transfer device 208 is operated to attach the micro-devices 202A from the donor substrate 204A to the transfer surface 214, only selected micro-devices are attached to the transfer surface 214. In particular, only the micro-devices 202A upon which the adhesive 212 has been dispensed are attached. These selected micro-devices therefore correspond to the micro-devices from the donor substrate 204A that are transferred to the destination substrate 206.

The transfer device 208 also includes a system to selectively "neutralize" the adhesive layer 212. In this context, "neutralize" includes either removing the adhesive layer entirely, e.g., by dissolving or melting, or modifying the physical property of the material so that it is no longer adhesive (also termed "denaturing"). The system can be an illumination system to selectively direct light, e.g., UV light from the light source onto the back side of the body that provides the transfer surface 214. Alternatively, the system can include heaters embedded in the body that provides the transfer surface 214. The neutralization system can act to neutralize all of the adhesive on the transfer surface 214, or be operable to neutralize adhesive in selective areas.

After the transfer surface 214 receives the selected micro-devices, the transfer device 208 is operated to cause the transfer surface 214 to transfer the selected micro-devices to the destination substrate 206. The adhesive 212 attaching the micro-devices 202A to the transfer surface 214 is neutralized such that the micro-devices 202A are transferable from the transfer surface 214 to the destination substrate 206. For example, the material forming the adhesive 212 can be is chemically altered to a non-adhesive form, thereby enabling the micro-devices 202A to be easily removed from the transfer surface 214 and placed on the destination substrate 206.

In this regard, selected micro-devices are thus transferred from the donor substrate 204A, to the transfer surface 214, and then from the transfer surface 214 to the destination substrate 206. As described herein, the selected micro-devices on the donor substrate 204A correspond to the ones with selectively dispensed adhesive.

These selected micro-devices on the donor substrate 204A have an initial configuration A. For example, if the selected micro-devices are uniformly spaced, configuration A is defined by a spacing in a first horizontal direction, a spacing in a second horizontal direction, or combinations thereof. In some implementations, configuration A refers to the configuration of the micro-devices on the donor substrate 204A upon which the adhesive 212 is selectively dispensed. When the transfer surface 214 receives the selected micro-devices, the selected micro-devices are in configuration B. In some implementations, configuration B refers to the configuration of the selected micro-devices on the transfer surface 214 after the transfer surface 214 receives the selected micro-devices and before the transfer surface 214 is transformed to alter the spacing of the selected micro-devices. When the transfer surface 214 transfers the selected micro-devices to the destination substrate 206, the selected micro-devices are in configuration C on the destination substrate 206. In some implementations, configuration C refers to the configuration of the selected micro-devices on the destination substrate 206 after the selected micro-devices are transferred from the transfer surface 214 to the destination substrate 206. Configuration C may correspond to a desired configuration of the micro-devices for the micro-device product to be fabricated.

In some implementations, configuration B and configuration A are the same.

In some implementations, the spacing in configuration C differs from the spacing in configuration B on the transfer surface 214 and configuration A on the donor substrate 204A. Configuration C, for example, may have a configuration having a spacing of micro-devices that cannot be attained from selecting micro-devices on the donor substrate 204A. In this regard, configuration A selected for the micro-devices 202A on the donor substrate 204A can have a spacing that is less than the spacing in configuration C.

The transfer surface 214 receives the micro-devices 202A in configuration B, which is substantially identical or similar to configuration A. The transfer device 208 is then operated to cause the micro-devices 202A to be moved from configuration B into configuration C. In some implementations, the transfer surface 214 corresponds to a film that is stretchable to increase the spacing between the micro-devices 202A received by the transfer surface 214. The micro-devices 202A are initially in configuration B on the transfer surface 214. After the film is stretched, the micro-devices 202A are transformed into configuration C on the transfer surface 214. The transfer surface 214 then transfers the micro-devices 202A to the destination substrate 206 such that the micro-devices 202A are positioned on the destination substrate in configuration C. In some examples, the transfer surface 214 is stretchable by 5 to 20 times in one or both horizontal dimensions so that the micro-devices on the transfer surface 214 are spaced 5 to 20 times further apart than their original spacing in configuration B.

If the transfer surface 214 is stretched, in some implementations, the adhesive 212 engaging the micro-devices 202A to the transfer surface 214 is also stretchable to ensure that the micro-devices 202A remain engaged to the transfer surface 214 after the transfer surface 214 is stretched. The adhesive 212 is, for example, an ultraviolet light curable polymeric material. In some examples, the adhesive 212 is 3D inkjet printable. The adhesive 212 can be a stretchable, flexible elastic polymeric material. In some implementations, the adhesive 212 is elastic deformable such that it elastically elongates between 100% to 500% of its original length. The viscosity of the adhesive 212 is, for example, between 80 and 100 centipoise at 25° C., between 10 and 20 centipoise at 70° C. The modulus of elasticity of the adhesive 212 is, for example, between 5 and 25 MPa at 25° C. The tensile strength of the adhesive 212 is, for example between 1 and 5 MPa with an elastically deformed elongation of 100% to 500% at 25° C.

In some implementations, configuration A on the donor substrate 204A may not have a uniform spacing between selected micro-devices. For example, failed or missing micro-devices 202A on the donor substrate 204A may prevent a configuration of selected micro-devices having uniform spacing. Configuration A is selected, for example, to maximize the number of selected micro-devices having uniform spacing.

If the transfer system 200 includes the detector 216, the detector 216 detects failed micro-devices 202A to prevent the failed micro-devices 202A from being transferred from the donor substrate 204A to the destination substrate 206. In particular, if the detector 216 detects failed micro-devices 202A, the controller 302 selectively operates the adhesive dispenser 210 such that the adhesive 212 is not selectively dispensed at locations corresponding to the locations of the failed micro-devices. As a result, when the controller 302 operates the transfer device 208 to transfer the micro-devices 202A from the donor substrate 204A to the transfer surface 214, the failed micro-devices 202A do not attach to the transfer surface 214.

To check the functionality of the LEDs, the detector 216 includes, for example, a radiation emitter and a radiation detector. If the micro-devices 202A are LEDs, for example, the LEDs can be excited to emit radiation when the LEDs are functioning properly. The radiation emitter emits radiation toward the micro-devices 202A positioned on the donor substrate 204A. The radiation excites the micro-devices 202A that are properly functioning such that the micro-devices 202A emit optical radiation detectable by the radiation detector. The radiation detector is, for example, a photodetector responsive to a wavelength of light emitted by the micro-devices when excited.

In this regard, signals from the detector 216 are usable, e.g., by the controller 302, to determine whether a given micro-device 202A is functioning properly. If the micro-device 202A is not functioning properly, e.g., the micro-device 202A is a failed micro-device, the controller 302 controls the adhesive dispenser 210 such that the adhesive 212 is not dispensed on the failed micro-device and the failed micro-device does not attach to the transfer surface 214. In some examples, the radiation emitted by the detector has a wavelength of 405 nm or shorter to excite the micro-devices.

The presence of failed micro-devices by the detector 216, in some cases, causes configuration A of the micro-devices 202A to have a non-uniform spacing. In some implementations, because adhesive 212 was not dispensed on failed micro-devices 202A on the donor substrate 204A, when the transfer surface 214 receives the selected micro-devices in configuration A from the donor substrate 204A, configuration A includes gaps 230 where micro-devices would have been positioned if the micro-devices in those positions on the donor substrate 204A were functioning properly.

A uniform spacing between the micro-devices when the micro-devices are on the destination substrate 206 can be desirable. For example, assuming that the micro-devices are LEDs, then gaps caused by absent or defective LEDs on a display panel are visually notable. In this regard, in some implementations, the transfer device 208 is a first transfer device, and, referring to FIG. 2C, the transfer system 200 includes the second transfer device 218 to fill the gaps 230 with micro-devices that are functioning properly. The second transfer device 218 includes the transfer surface 220 with functioning micro-devices 232A of the same type as micro-device 202A. The micro-devices 232A have been checked using a detector, e.g., a radiation emitter and a radiation detector, to determine that they are functioning properly.

Referring to FIG. 5, the second transfer device 218 transfers a micro-device 232A to a receiving substrate 234. The second transfer device 218, for example, transfers micro-devices 232A one at a time to the receiving substrate. The second transfer device 218 is, for example, as shown in FIG. 5, a rotatable roller 236 including the transfer surface 220 to carry the micro-devices 232A. The receiving substrate 234 is, for example, the transfer surface 214. For example, the donor substrate 204A can include a set of selected micro-devices 202A in configuration A. The transfer surface 214 of the first transfer device 208 receives the micro-devices 202A, the micro-devices 202A having configuration B, which is substantially identical to configuration A.

After the transfer surface 214 of the first transfer device 208 has received the micro-devices 202A from the donor substrate 204A in configuration B, the transfer surface 214 of the first transfer device 208 may include the gaps 230, e.g., due to detection of failed micro-devices 202A on the donor substrate 204A. Adhesive 212 is dispensed on the transfer surface 214 of the first transfer device 208. The second transfer device 218 then causes a functioning micro-device 232A on the transfer surface 220 of the second transfer device 218 to engage with the adhesive 212 such that the functioning micro-device 232A is transferred to the transfer surface 214 of the first transfer device 208. In particular, the functioning micro-device 232A is positioned on the transfer surface 214 of the first transfer device 208 to fill a gap 230.

After each of the gaps 230 have been filled, the micro-devices on the transfer surface 214 of the first transfer device 208 have uniform spacing. If necessary, the micro-devices are manipulated to have desired configuration C. In this regard, if configuration B of the micro-devices on transfer surface 214 of the first transfer device 208 includes gaps, to transform the micro-devices to achieve configuration C, the process includes an operation to fill the gaps in configuration B and, in some cases, an operation to alter the spacing of configuration B between the micro-devices. Once the desired spacing has been achieved and the gaps have been filled, the micro-devices are transferred from the transfer surface 214 of the first transfer device 208 to the destination substrate 206 such that the micro-devices have configuration C on the destination substrate 206.

In some implementations, instead of being a transfer surface of a transfer device, the receiving substrate 234 is the destination substrate 206. The transfer surface 214 of the first transfer device 208, for example, transfers the micro-devices to the destination substrate 206 having a desired spacing in accordance with the uniform spacing of desired configuration C. However, when initially positioned on the destination substrate 206, the micro-devices 202 are not in configuration C due to the gaps between the micro-devices on the destination substrate 206. After the gaps are filled by the micro-devices 232A on the second transfer device 218, the micro-devices are in configuration C on the destination substrate 206, thus having the desired spacing and pattern defining configuration C. In some examples, to transfer a micro-device 232A from the transfer surface 220 of the second transfer device 218, the micro-device 232A is released from the transfer surface 220 of the second transfer device 218. The micro-device 232A, for example, is attached to the transfer surface 220 by an adhesive that is denatured or removed when the micro-device 232A is positioned at or over the gap to be filled on the destination substrate.

Figure 2C:
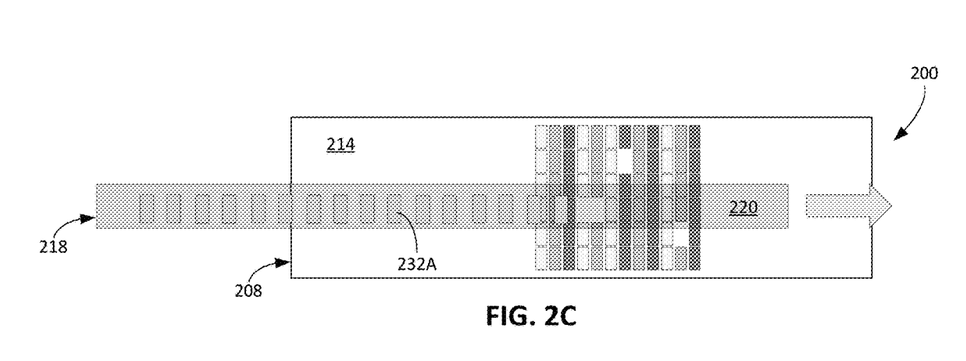
Figure 3:
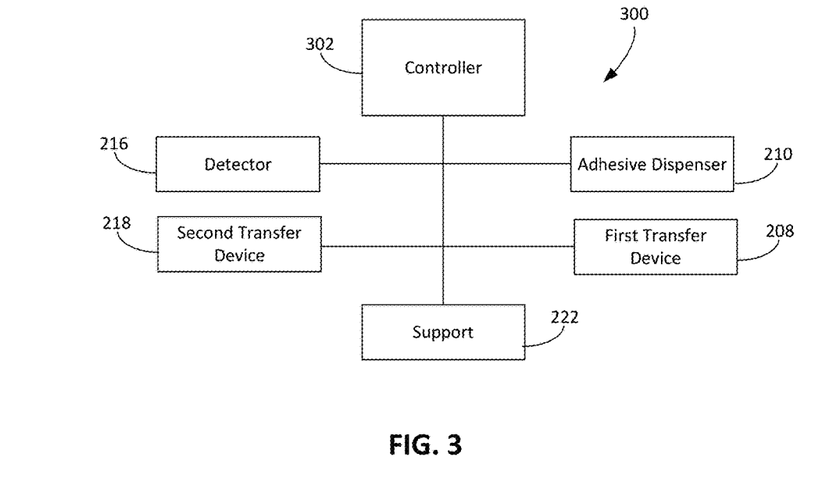
FIG. 3 is a block diagram of an example of a system to transfer micro-devices.

While FIGS. 2A through 2C have been described with respect to a single donor substrate 204A having a single type of micro-device 202A, alternatively or additionally, a transfer system includes additional donor substrates with additional types of micro-devices. As shown in FIG. 2A, the transfer system 200 includes a donor substrate 204B with micro-devices 202B and a donor substrate 204C with micro-devices 202C. If the micro-devices 202A, 202B, 202C are LEDs, the micro-devices 202A, 202B, 202C, for example, each emit a different color light, e.g., red, green, blue, or the like.

The adhesive dispenser 210 dispenses adhesive on each of the donor substrates 204A, 204B, 204C, in particular, on selected micro-devices 202A, 202B, 202C on each of the donor substrate 204A, 204B, 204C. The transfer device 208 uses the transfer surface 214 to pick up the selected micro-devices 202A, 202B, 202C from each of the donor substrates 204A, 204B, 204C. Adhesive 212 is dispensed on the micro-devices 202A, 202B, 202C such that the selected micro-devices 202A, 202B, 202C of each type are in configuration A. In this regard, when received by the transfer surface 214 of the transfer device 208, the selected micro-devices 202A, 202B, 202C are each in configuration A.

The selected micro-devices 202A, 202B, 202C, altogether, are in configuration B. Configuration B, for example, is further defined by an ordering of the micro-devices 202A, 202B, 202C and spacing between adjacent types of micro-devices 202A, 202B, 202C. With respect to the ordering of the micro-devices 202A, 202B, 202C, in the example shown in FIG. 2B, going left to right, micro-devices 202A are followed by micro-devices 202B, which are in turn followed by micro-devices 202C. In some implementations, the intra-type spacing between a specific type of micro-device, i.e., between micro-devices 202A, between micro-devices 202B, or between micro-devices 202C, differs from the inter-type spacing between two types of micro-devices, i.e., between a micro-device 202A and a micro-device 202B, between a micro-device 202B and a micro-device 202C, or between a micro-device 202A and a micro-device 202C. Configuration B is defined, in some cases, by inter-type spacing, intra-type spacing, or both.

As described herein, the transfer surface 214 is transformable to increase or decrease intra-type spacing of the micro-devices 202A, 202B, 202C on the transfer surface 214. The transfer surface 214 is alternatively or additionally transformable to increase the inter-type spacing of the micro-devices 202A, 202B, 202C on the transfer surface 214. The transfer surface 214 is transformed to attain the desired inter-type and/or the desired intra-type spacing for configuration C of the micro-devices 202A, 202B, 202C on the destination substrate 206.

In some implementations, the second transfer device 218, if present, includes functioning micro-devices of each type of the micro-devices 202A, 202B, 202C on the transfer surface 220. To fill a gap in configuration B, adhesive 212 is placed on the receiving substrate 234, e.g., the transfer surface 214 of the first transfer device 208, and then the appropriate type of functioning micro-device is engaged to the adhesive 212. To fill a gap to achieve configuration C on the destination substrate 206, the appropriate type of the functioning micro-device is released onto the destination substrate 206. In some implementations, the system 200 includes multiple second transfer devices, each having a single type of functioning micro-devices. For example, if the system 200 includes three types of micro-devices, the system 200 can include three second transfer devices each having one of the micro-device types.

FIGS. 6A to 6H depict sequential operations 600A to 400H, respectively, in which the system performs operations including dispensing the powder, fusing the powder, and reclaiming powder that was not fused. Before beginning the operations 600A to 600H, the controller (e.g., the controller 302) of the system can receive electronic data, e.g., computer-aided drafting data, indicative of the array of the micro-devices to be formed. As is described herein, the system uses the controller to control individual sub-systems or components of the system to execute the operations.

Figure 6A:
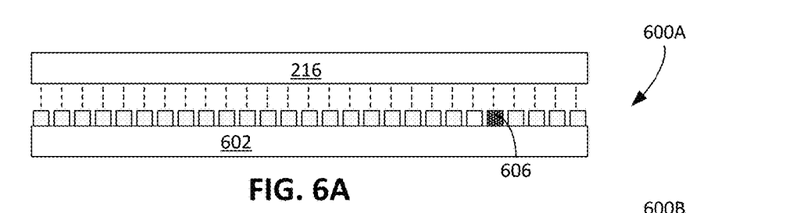
FIGS. 6A to 6F are side views of a system performing a process to transfer micro-devices from a donor substrate to a destination substrate Like reference numbers and designations in the various drawings indicate like elements.
Figure 6B:
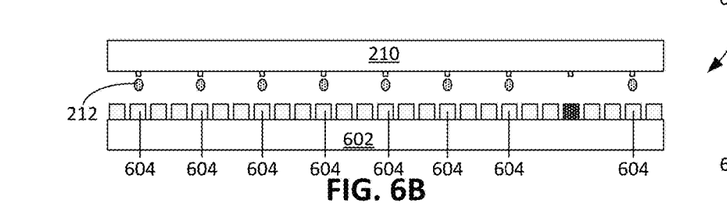

In some implementations, as shown in FIG. 6A, at operation 600A, the controller operates the detector 216 to detect failed micro-devices on a donor substrate 602. At operation 600B shown in FIG. 6B, the controller operates the adhesive dispenser 210 to dispense the adhesive 212 onto selected micro-devices 604. In some cases, the system does not detect failed micro-devices and thus, at operation 600B, dispenses the adhesive 212 onto selected micro-devices 604 without operating a detector to detect failed micro-devices. In some implementations, if the detector 216 is present and detects a failed micro-device 606, the controller receives a signal indicative of the failed micro-device 606 and controls the adhesive dispenser 210 such that the adhesive dispenser 210 does not dispense adhesive 212 onto the failed micro-device 606. In some implementations, the controller operates the detector 216 to detect the failed micro-devices within a row of micro-devices, and then the controller operates the adhesive dispenser 210 to dispense the adhesive 212 on the functioning micro-devices in the row of the micro-devices. The controller repeats the detection operation 600A and dispensing operation 600B until the adhesive 212 is delivered to the desired number of micro-devices.

Figure 6C:
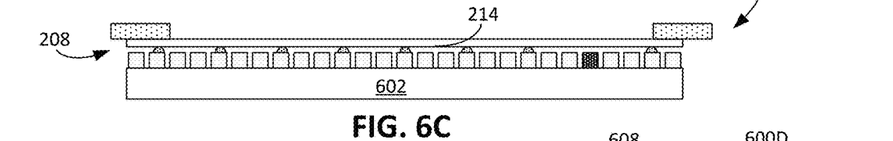
Figure 6D:
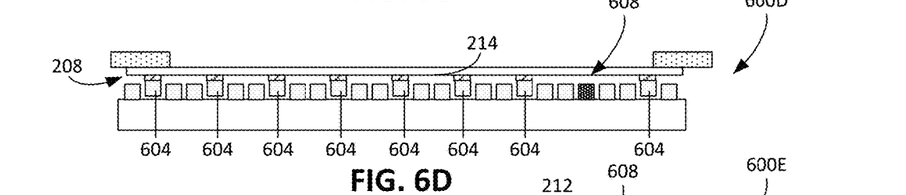
Figure 6E:
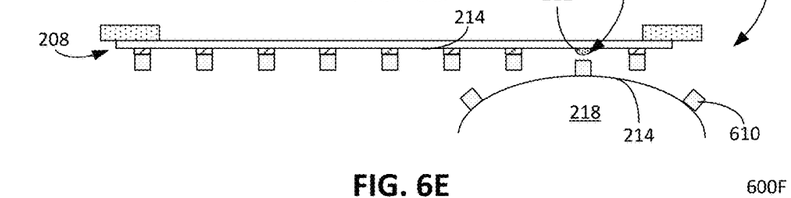

At operation 600C as shown in FIG. 6C, the controller operates the transfer device 208 to move the transfer surface 214 to engage with the selectively dispensed adhesive 212. At operation 600D as shown in FIG. 6D, the controller operates the transfer device 208 to move the transfer surface 214 relative to the donor substrate 602, thereby removing the selected micro-devices 604 from the donor substrate 602. For example, the transfer surface 214 can be lifted away from the donor substrate 602, e.g., normal to the surface of the donor substrate.

In some implementations, if there is a gap between micro-devices on the transfer surface 214, for example, due to detection of a failed micro-device on the donor substrate 204A, the controller operates the second transfer device 218 to fill the gap with a functioning micro-device 606. For example, at operation 600E shown in FIG. 6E, the system causes adhesive 212 to be dispensed at a gap 608 on the transfer surface 214. The gap 608, for example, corresponds to a location of where the failed micro-device 606 would have been if the failed micro-device 606 had not failed. To transfer a functioning micro-device 610 on the transfer surface 220 of the second transfer device 218 to the transfer surface 214 of the first transfer device 208, the controller operates the second transfer device 218 to engage the functioning micro-device 610 with the adhesive 212.

Figure 6F:
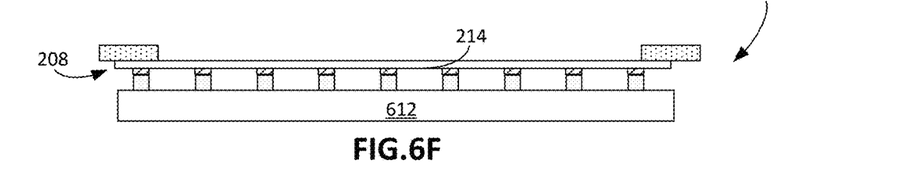

After operation 600E if there is a gap 608 or after operation 600D if there are no gaps, at operation 600F, the controller operates the transfer device 208 to transfer the micro-devices 604 from the transfer surface 214 to a destination substrate 612. In particular, the transfer surface 214 can be lowered until the micro-devices 604 abut the destination substrate 612, the adhesive can be neutralized, and the transfer surface 214 can be lifted away.

The examples described herein with respect to FIGS. 1 to 6F illustrate some implementations of methods and systems within the scope of the present disclosure. Other implementations are possible. For example, in some implementations, the transfer system 200 includes an etching device to etch a micro-device wafer on a donor substrate into multiple micro-devices. The etching device etches the micro-device wafer into, for example, lateral micro-devices or vertical micro-devices. The etching device uses, for example, a laser scribing or dry etching method to separate the micro-device wafer into micro-devices.

In some implementations, a predefined number of rows of micro-devices are transferred from the donor substrate to the transfer surface during a single transfer operation of micro-devices from the donor substrate to the transfer surface. The transfer surface picks up, for example, 5 to 20 rows of micro-devices from the donor substrate and then transfers these rows to the destination substrate. The transfer surface continues to transfer the predefined number of rows of the micro-devices from the donor substrate to the destination substrate until the desired number of rows have been transferred.

In some implementations, the micro-devices are fabricated into a lateral device in which both p-type and n-type contacts are fabricated on the same side. Photolithography and dry etching are applied to define a mesa structure and to expose an n-type device layer. Transparent conductive oxides layer, e.g., indium tin oxide, is deposited on the p-type device surface to improve current spreading. N-type and p-type ohmic contacts are formed afterwards through photolithography and deposition. A dielectric layer is deposited on the lateral device surface and sidewall to reduce surface leakage current and improve device reliability performance.

In some implementations, the micro-devices are fabricated into a vertical device where the p-type and n-type contacts are made on opposite sides. A reflective mirror can be fabricated on the p-side of the vertical device to improve light extraction. After metallization, the micro-devices are wafer-bonded to a conducting carrier wafer. The destination substrate can then be removed through laser or chemical lift-off method before electrodes are fabricated on the n-type layer.

In some implementations, products may need multiple micro-devices 202A, 202B, 202C of different types in each cell of the product to be formed. For example, for a color LED display may need three micro-LEDs, one for each of red, blue and green. Each micro-LED can provide a sub-pixel. A variety of patterns are possible for the sub-pixels. For example, the different colored sub-pixels can simply be arranged in a single row or column. Alternatively, for example, the sub-pixels within a cell can be arranged in a quincunx pattern with two sub-pixels each of two colors, e.g., red and green, and a single sub-pixel of the third color, e.g., blue (this pattern is also known as a PenTile matrix). The transfer techniques can be used to form displays with more than three color sub-pixels, e.g., a display with red, green, blue and yellow micro-LEDs.

The different color LEDs can be LEDs with phosphor layers that emit differently colored light, or they can be LEDs with different colored filter layers, or they can be LEDs that emit white light but also include an overlaying phosphor material that absorbs the white light and re-emits differently colored light (this material can be quantum dots).

The different micro-devices, e.g., the different color micro-LEDs, can be fabricated on different donor substrates at higher spatial density than needed for the destination substrate. The transfer process can then be performed for each donor substrate. That is, the micro-devices from each particular donor substrate can be transferred to its own transfer substrate. For example, there can be a transfer substrate with blue micro-LEDs, a transfer substrate with red micro-LEDs, and a transfer substrate with green micro-LEDs. For each transfer substrate, a micro-device can be transferred for each cell to the destination substrate.

In some implementations, the destination substrate 206 is a flexible substrate. For example, the destination substrate 206 can be a flexible circuit and micro-devices 110 can be micro-LEDs, thus providing a flexible display screen. Alternatively or in addition, the destination substrate 206 can a stretchable substrate. The destination substrate is, for example, the backplane of a flat-panel display.

In some implementations, both the n-type and p-type contacts and interconnecting circuitry are pre-fabricated on the destination substrate so that transferred micro-devices are electrically connected after they are placed on the destination substrate. In another example, only one type of contact is pre-fabricated on the destination substrate. A shadow mask or photolithography method can be used to fabricate the other type of contact.

The controller can be implemented in digital electronic circuitry, or in computer software, firmware, or hardware, or in combinations of them. The controller can include one or more computer program products, i.e., one or more computer programs tangibly embodied in an information carrier, e.g., in a non-transitory machine readable storage medium or in a propagated signal, for execution by, or to control the operation of, data processing apparatus, e.g., a programmable processor, a computer, or multiple processors or computers. A computer program (also known as a program, software, software application, or code) can be written in any form of programming language, including compiled or interpreted languages, and it can be deployed in any form, including as a standalone program or as a module, component, subroutine, or other unit suitable for use in a computing environment. A computer program can be deployed to be executed on one computer or on multiple computers at one site or distributed across multiple sites and interconnected by a communication network.

The processes and logic flows described in this specification can be performed by one or more programmable processors executing one or more computer programs to perform functions by operating on input data and generating output. The processes and logic flows can also be performed by, and apparatus can also be implemented as, special purpose logic circuitry, e.g., an FPGA (field programmable gate array) or an ASIC (application specific integrated circuit).

A number of implementations have been described. Nevertheless, it will be understood that various modifications may be made. Accordingly, other implementations are within the scope of the claims.

What is claimed is:

1. An apparatus for positioning micro-devices on a substrate, the apparatus comprising:
   one or more supports to hold a donor substrate and a destination substrate;
   an adhesive dispenser to deliver adhesive onto micro-devices on the donor substrate by ejecting droplets of adhesive;
   a transfer device including a transfer surface to transfer the micro-devices from the donor substrate to the destination substrate; and
   a controller configured to
      operate the adhesive dispenser to selectively dispense the adhesive onto selected micro-devices on the donor substrate based on a desired spacing of the selected micro-devices on the destination substrate such that droplets of adhesive are ejected onto less than all of the micro-devices on the donor substrate,
      operate the transfer device such that the transfer surface engages the adhesive on the donor substrate to cause the selected micro-devices to adhere to the transfer surface,
      operate the transfer device to withdraw the transfer surface from the donor substrate such that the selected micro-devices detach from the donor substrate and remain adhered by the adhesive to the transfer surface,
      operate the transfer device to lower the transfer surface toward the destination substrate so that the selected micro-devices engage the destination substrate, and
      operate the transfer device to withdraw the transfer surface from the destination substrate such that the selected micro-devices are transferred from the transfer surface to the destination substrate.

2. The apparatus of claim 1, wherein the controller is configured to operate the transfer device such that the transfer surface transfers first micro-devices to the destination substrate and then transfers second micro-devices to the destination substrate such that the second micro-devices adjacent to the first micro-devices, the first micro-devices and the second micro-devices both having the desired spacing on the destination substrate.

3. The apparatus of claim 2, wherein the controller is configured to operate the transfer device to transfer the first micro-devices from a first donor substrate and to transfer the second micro-devices from a second donor substrate.

4. The apparatus of claim 1, wherein the transfer device is a first transfer device, and the apparatus further comprises a second transfer device including a second transfer surface to transfer at least one additional micro-device to the transfer surface of the first transfer device or to the destination substrate.

5. The apparatus of claim 4, wherein the second transfer device is configured to transfer a single micro-device at a time to a receiving surface, wherein the receiving surface is (i) the transfer surface of the first transfer device or (ii) a surface of the destination substrate.

6. The apparatus of claim 5, wherein the controller is configured to operate the second transfer device such that the transfer surface of the second transfer device transfers the single micro-device from the donor substrate to a receiving surface to fill a gap between the selected micro-devices on the receiving surface with the single micro-device, thereby achieving a desired arrangement of the selected micro-devices on the receiving surface.

7. The apparatus of claim 5, wherein the controller is configured to operate the adhesive dispenser to dispense adhesive on the receiving surface after the selected micro-devices are adhered to the receiving surface, and to operate the second transfer device such that the transfer surface of the second transfer device engages the single micro-device with the second dispensed adhesive when the transfer surface of the second transfer device transfers the single micro-device to the receiving surface.

8. The apparatus of claim 4, wherein the second transfer device is configured to transfer a plurality of micro-devices to the destination substrate.

9. The apparatus of claim 1, further comprising a sensor to detect one or more defective micro-devices on the donor substrate, and wherein the controller is configured to selectively dispense the adhesive such that the adhesive is not dispensed on the one or more failed micro-devices and the selected micro-devices does not comprise the one or more failed micro-devices.

10. The apparatus of claim 9, wherein the sensor comprises circuitry configured to optically excite the micro-devices on the donor substrate and an optical detector to detect light emitted by the micro-devices on the donor substrate.

11. The apparatus of claim 9, wherein:
the transfer device is a first transfer device,
the apparatus further comprises a second transfer device including a second transfer surface to transfer a single micro-device at a time to the transfer surface of the first transfer device or transfer micro-devices to the destination substrate, and
the controller is configured to
operate the first transfer device such that the transfer surface of the first transfer device engages the adhesive on the donor substrate to cause the selected micro-devices to adhere to the transfer surface of the first transfer device, and
operate the second transfer device such that the second transfer surface of the second transfer device transfers one or more micro-devices to the transfer surface of the first transfer device based on a location of the one or more defective micro-devices.

12. The apparatus of claim 1, wherein the transfer surface comprises a stretchable film to receive the selected micro-devices.

13. The apparatus of claim 12, comprising an actuator coupled to the stretching film, and wherein the controller is configured to cause the actuator to stretch the film such that the selected micro-devices to have the desired spacing when the transfer surface transfers the selected micro-devices to the destination substrate.

14. The apparatus of claim 1, wherein the transfer device comprises a roller to receive the selected micro-devices from the donor substrate.

15. The apparatus of claim 1, wherein the transfer surface comprises a planar surface to receive the selected micro-devices from the donor substrate.

16. The apparatus of claim 1, wherein the transfer device includes a heating element to heat the transfer surface when the transfer surface transfers the selected micro-devices to the destination substrate.

17. The apparatus of claim 1, further comprising a radiation emitter to emit a pattern of radiation to cure the selectively dispensed adhesive before operating the transfer device.

* * * * *

UNITED STATES PATENT AND TRADEMARK OFFICE
CERTIFICATE OF CORRECTION

PATENT NO. : 10,032,827 B2  
APPLICATION NO. : 15/270763  
DATED : July 24, 2018  
INVENTOR(S) : Mingwei Zhu et al.

Page 1 of 1

It is certified that error appears in the above-identified patent and that said Letters Patent is hereby corrected as shown below:

In the Claims

Column 16, Line 37, in Claim 2, insert --are-- before "adjacent".

Column 18, Line 10, in Claim 13, delete "stretching" and insert --stretchable-- therefor.

Column 18, Line 12, in Claim 13, delete "to".

Signed and Sealed this  
Twenty-third Day of October, 2018

Andrei Iancu  
*Director of the United States Patent and Trademark Office*